United States Patent [19]

Wolf et al.

[11] Patent Number: 5,233,753

[45] Date of Patent: Aug. 10, 1993

[54] METHOD OF MAKING INJECTION-MOULDED PRINTED CIRCUIT BOARDS

[75] Inventors: Gerhard D. Wolf, Dormagen; Henning Giesecke, Cologne; Joachim Wank, Dormagen, all of Fed. Rep. of Germany

[73] Assignee: Bayer Aktiengesellschaft, Leverkusen, Fed. Rep. of Germany

[21] Appl. No.: 788,958

[22] Filed: Nov. 7, 1991

[30] Foreign Application Priority Data

Nov. 16, 1990 [DE] Fed. Rep. of Germany ....... 4036592

[51] Int. Cl.$^5$ .............................................. H05K 3/20
[52] U.S. Cl. ...................................... 29/831; 29/846; 29/847; 428/901
[58] Field of Search .................... 29/831, 846, 847; 174/261; 427/96, 98

[56] References Cited

U.S. PATENT DOCUMENTS

| | | | |
|---|---|---|---|
| 4,584,039 | 4/1986 | Shea | 29/846 X |
| 4,584,767 | 4/1986 | Gregory | 174/261 X |
| 4,710,419 | 12/1987 | Gregory | 29/846 X |
| 4,810,321 | 3/1989 | Wank et al. | |
| 4,832,989 | 5/1989 | Giesecke et al. | |
| 4,868,047 | 9/1989 | Hasegawa et al. | 428/901 X |
| 4,906,515 | 3/1990 | Inoguchi | 428/901 X |
| 4,910,045 | 3/1990 | Giesecke et al. | |
| 4,944,087 | 7/1990 | Landi | 29/846 X |
| 5,108,530 | 4/1992 | Niebling, Jr. et al. | |

FOREIGN PATENT DOCUMENTS

| | | |
|---|---|---|
| 1271374 | 7/1990 | Canada . |
| 0067902 | 12/1982 | European Pat. Off. . |
| 1-266789 | 10/1989 | Japan .............................. 29/847 |
| 1-278090 | 11/1989 | Japan .............................. 29/846 |
| 87/01557 | 3/1987 | United Kingdom . |

OTHER PUBLICATIONS

IBM Technical Disclosure Bulletin vol. 2 No. 1 Jun. 1959, p. 9 by Haddad et al.
IBM Technical Disclosure Bulletin vol. 8 No. 8, Jan. 1966, pp. 1025-1025 by Webb et al.
IBM Technical Disclosure Bulletin vol. 9 No. 11 Apr. 1967, pp. 1520-1521 by Kollmeier et al.
IBM Technical Disclosure Bulletin vol. 14 No. 1 Jun. 1971 p. 101 by David et al.

*Primary Examiner*—Carl J. Arbes
*Attorney, Agent, or Firm*—Sprung Horn Kramer & Woods

[57] ABSTRACT

Injection-moulded printed circuit boards which have been obtained by injection-moulding thermoplastic materials onto the back of flexible circuits are of a particularly high quality if the conductor tracks have been produced on the flexible carriers employed by direct additive or semiadditive metallisation.

7 Claims, No Drawings

METHOD OF MAKING INJECTION-MOULDED PRINTED CIRCUIT BOARDS

BACKGROUND OF THE INVENTION

1. Field of the Invention

The present invention relates to injection-moulded printed circuit boards and processes for their production. The essence of the invention is that thermoplastic materials are injection-moulded onto the back of flexible carrier materials, onto which the conductor tracks have been applied by certain fully or semiadditive techniques before or after the injection-moulding onto the back.

Injection-moulding thermoplastic materials onto the back of films to produce decorative shaped articles and also to produce injection-moulded components which carry electrical or electronic circuits and can thus also be called "injection-moulded printed circuit boards" are known.

2. Description of the Related Art

Flexible circuits, that is to say films, which contain conductor tracks on one side or also those on which conductor tracks are located on both sides and if appropriate the two sides are also connected to one another electrically by plated-through holes are thus placed in injection moulds and thermoplastic material is injection-moulded onto the back of them. Printed circuit boards on which the electrical/electronic circuits are located in one plane can also be produced in this manner. Preferably, however, this technique of injection-moulding onto the back of circuits is used to produce three-dimensional "injection-moulded circuits" (EP-A 0,067,902).

The flexible circuits for the production of injection-moulded printed circuit boards can be produced by printing a conductive paste, preferably a paste which contains Ag powder, Cu powder, Ni powder or graphite in the form of the circuit pattern onto a carrier film with the aid of the screen printing technique (WO 87/01557).

Such flexible circuits can likewise be employed for producing injection-moulded printed circuit board which are obtained by subtractive processes. To produce these boards, copper foils are laminated onto carrier films with the aid of an adhesive, the copper surface is provided with an etch resist in the form of the conductor tracks pattern by customary techniques, the non-covered areas of the copper foil are etched away in a customary copper etching bath, and finally the etch resist is stripped off again.

In a particular embodiment of the production of injection-moulded circuits, the copper-laminated film on which the copper surface is partly provided, that is to say in the form of the conductor tracks pattern, with an etch resist is placed in the injection mould and a thermoplastic is injection-moulded onto the back. The conductor tracks are produced on the three-dimensional injection moulding by etching away the copper zones not covered with etch resist (U.S. Patent Specification 4,710,419).

The processes described have various disadvantages:

The conductor tracks, which consist of polymers filled with metal powder, have a relatively low conductivity and cannot be soldered, which greatly limits the use of such circuits.

Flexible circuits which have been produced by subtractive processes from carrier films, preferably polyimide films, laminated with copper foil for materials to be injection-moulded onto their back have the following adverse features:

The thickness of the copper layer is at least 17.5 $\mu$m. Conductor tracks of this or a higher layer thickness can suffer fractures at the corners and edges of the three-dimensional bodies to be produced by material being injection-moulded onto the back. Even one interruption in a conductor track already causes the entire circuit to be incapable of functioning.

The intermediate layer of adhesive (20–30 $\mu$m thick) needed for a firmly adhering lamination has lower electrical and thermal properties than the flexible carrier material, preferably Kapton ® film. This has a particularly adverse effect if circuits are to be produced with fine conductor tracks.

SUMMARY OF THE INVENTION

A process has now been found for the production of injection-moulded printed circuit boards by injection moulding a thermoplastic polymer material onto the back of flexible circuits in injection moulds, which avoids the disadvantages described and leads to injection-moulded printed circuit boards of decidedly high quality.

The additive process is characterised by the use of flexible carriers, onto the surface of which conductor tracks have been applied in a firmly adhering manner by a procedure in which a. the flexible carrier is printed with a screen printing paste, which contains an activator (that means a metallisation catalyst) in the form of the conductor track pattern, b. the thinly applied print of the conductor track pattern is conditioned by drying or heat treatment processes for subsequent electroless metallisation, and c. finally, a copper layer in the form of the printed conductor track pattern in a height of 0.05–10 $\mu$m, preferably 0.1–4 $\mu$m, is built up in a chemical, electroless copper bath.

DETAILED DESCRIPTION OF THE INVENTION

In another embodiment as a semiadditive process, flexible carriers are employed, onto the surface of which conductor tracks have been applied in a firmly adhering manner by a procedure in which a. the entire surface of the flexible carrier is coated with a screen printing paste containing an activator (that means a metallisation catalyst), b. the layer applied is conditioned by drying or heat treatment processes for subsequent electroless metallisation, c. The printing area is provided with a copper layer having a thickness of 0.05–3 $\mu$m, preferably 0.05 to 0.5 $\mu$m, in a electroless copper bath, d. a plating resist is then applied in the form of the negative conductor track pattern in accordance with the customary prior art, e. the conductor track pattern is built up in an electroplating copper bath, and in particular in a height of 5–50 $\mu$m, preferably 10–35 $\mu$m, and f. after the resist has been stripped off, etching is carried out in order to obtain the desired circuit.

In another embodiment, the fact that the conductor tracks at the edges and corners of the three-dimensional circuits to be produced could fracture during injection-moulding of material onto the back can be avoided particularly easily. In this embodiment, flexible carriers are employed, onto the surface of which a screen printing paste, which contains an activator, is printed in the form of the conductor track pattern, the thermoplastic material is injection-moulded onto the back, in this not yet metallised state, and after the injection moulding on the back the copper layer is built up in the form of the desired conductor track pattern and in a height of 0.05–10 μm, preferably 0.1–4 μm, in a chemical, electroless copper bath.

It is of course also possible to employ flexible carriers, over the entire surface of which a screen printing paste which contains an activator has been applied, in order to build up, after material has been injection-moulded onto the back, an approximately 2–3 μm copper layer over the entire surface in a chemical, electroless copper bath, it being possible for a conductor track pattern subsequently to be build up by the semiadditive technique on the basis of this copper layer. This can also be effected by a procedure in which the plating resist is already applied in the form of the negative conductor tracks by known techniques before material is injection-moulded onto the back.

In another embodiment, flexible carriers are employed, onto the surface of which a screen printing paste containing an activator is applied over the entire surface and a plating resist is additionally applied in the form of the negative conductor track pattern, a circuit being built up in the form of the desired conductor track pattern with a copper layer thickness of 0.05–10 μm, preferably 1–5 μm, in a chemical, electroless copper bath after material has been injection-moulded onto the back.

In another preferred embodiment of the process for the production of injection-moulded printed circuit boards, flexible carriers are employed, onto the surface of which the screen printing Paste which contains an activator has been applied but which have been preshaped by a blow moulding technique before material is injection-moulded onto the back. The metallised circuits described above can of course also be preshaped.

Various customary vacuum or compressed air moulding processes can be used for blow moulding the flexible carriers. However, a high-pressure moulding technique such as is described, for example, in DE-OS (German Published Specification) 3,840,542 is preferably used.

Various film substrates can be employed for production of the flexible circuits to be employed for having material injection-moulded onto the back. Examples are films of polyethylene, polypropylene and polyvinyl chloride, of polyamides and polyalkylene and polyarylene terephthalates, and of polysulphones, polyphenylene sulphide, polycarbonates and polyimides. Substrates such as are employed in printed circuit board production, for example films of polyester, polycarbonate and polyimide, are particularly preferred.

In addition to the polyimides, polyimide-like films are also suitable, polyimide-like substrates being understood as those which, in addition to polyimide groups, also contain other functional groups, such as, for example, amide, ester, ether, sulphone or sulphate groups.

To produce circuits on the carrier films described, formulations, such as screen printing pastes, containing activator are printed over a part area, that is to say in the form of a conductor track pattern, onto the film substrates. After the formulations which have been printed on have dried, the printed structures can be metallised by dipping into suitable metallisation baths.

However, a procedure can also be followed in which the formulations containing the activator are applied, for example printed on or knife-coated on, over the entire surface and, after drying, thin layers of metal are produced over the entire surface of the formulations applied by dipping in suitable metallisation baths. Circuits can then be produced on the basis of these thin layers of metal by the customary semiadditive techniques.

The formulations containing activators which are preferably employed are those which are described in DE-OS (German Published Specification) 3,625,587, DE-OS (German Published Specification) 3,627,256 and DE-OS (German Published Specification) 3,743,780.

After the formulations containing activators have been applied to the film surfaces, the solvents are removed—as already described—by drying. Drying can be carried out at various temperatures, for example between room temperature and 350° C., under atmospheric pressure or in vacuo. The drying time can, of course, be varied greatly.

After drying, the formulations which contain activators and have been applied to part areas of or the entire film surfaces must be sensitised by reduction. The customary reducing agents in electroplating, such as, for example, formaldehyde, hypophosphites and boranes, can preferably be used for this purpose.

A particularly preferred embodiment comprises carrying out the reduction in the metallisation bath directly with the reducing agent of the electroless metallisation. This procedure is particularly suitable for nickel baths containing amidoborane or copper baths containing formalin.

The film surfaces activated with the formulations are metallised in a further process step. Baths containing salts of nickel, cobalt, iron, copper, silver, gold and palladium or mixtures thereof are particularly suitable for this. Such metallisation baths are known in the art of electroless metallisation.

Copper baths containing formalin are particularly preferred for producing flexible circuits according to the present invention. The coppering can in principle be carried out in various commercially available electroless coppering baths. Examples of such baths are: Cuposit® Copper Mix 328 Cu from Shipley, Cuposit® CP-78 from Shipley, Dynaplate® Electroless Copper 850 from Dynachem, Enplate® Cu 701 from Imasa, Enplate® Cu 872 from Imasa, Printoganth® ML from Schering or Noviganth® T from Schering. The copper bath Printoganth® ML from Schering has proved to be particularly suitable for producing flexible circuits using the activator-containing formulations described.

As explained above in detail, the metallisation of the pastes which contain activators and have been printed on can be carried out before material is injection-moulded onto the back, by dipping the printed films into a suitable metallisation bath, or after material is injection moulded onto the back, by dipping the finished injection moulding, which is bonded to the printed film in a firmly adhering manner, into one of the metallisation baths described.

It has also already been explained that the procedure for production of the circuits can be either in accordance with the additive technique or in accordance with the semiadditive technique.

In the additive process, the film is printed over a part area, that is to say in the pattern of the circuit to be produced, with the formulation which contains the activator and is dried and dipped into a suitable metallisation bath, preferably a coppering bath. In the metallisation bath, a layer of metal is deposited everywhere where and also only where paste has been printed on. The height of the metal layer, preferably the copper layer, is a function of the metallisation time. In the Printoganth ® ML coppering bath from Schering, about 3 μm of copper are deposited in one hour. Considerably higher copper layer thicknesses can also be achieved over longer residence times in the copper bath.

In the semiadditive process, the entire surface of the flexible carrier is printed with a formulation containing a metallisation activator, the thinly applied print is conditioned by drying or heat treatment processes for subsequent electroless metallisation, a plating resist is then applied in the form of the negative conductor track pattern in accordance with the customary prior art, the conductor track pattern is metallised in an electroplating copper bath and after the resist has been stripped off, the copper surface is etched under acid or alkaline conditions until the desired circuit has been obtained.

It is one of the surprising results of this process that very thin copper layers on films can evidently be moulded or have material injection moulded onto the back better than thicker layers. It is therefore of course also possible for material to be injection-moulded onto the back of conductor tracks which have been produced by other additive or semiadditive processes, for example by physical metallisation, such as vapour deposition or sputtering, or wet chemical electroless metallisation, if appropriate after prior roughening, slight etching or swelling of the surface to improve the adhesion of the metal layer.

Preferred flexible substrates for the processes described are those having a metal layer of 0.01 to 8 μm, especially preferably with a thickness of 0.05–4 μm. Copper is the preferred metal.

A preferred embodiment comprises using films which have been metallised over the entire surface, applying a negative image of a circuit onto these by means of a electroplating resist, subsequently injection-moulding material onto the back of these (if appropriate after prior blow moulding of the film) and then producing the printed circuit board semiadditively.

Other purely additive or subtractive processes can of course also be used for production of the circuits with material injection-moulded onto the back.

To produce the "injection-moulded circuits", thermoplastic material is injection-moulded, in customary injection moulding machines, onto the back of the films described above which already contain copper circuits or which contain a dried application of a formulation which contains an activator. For this, the films are placed in injection moulds, so that the non-coated side of the film is coated with the melt injected in. The injection mould has an elevated temperature of between 70° and 150° C., depending on the thermoplastic material used. After the injection moulds have been closed, the thermoplastic, which has a material temperature of between 230° and 330° C., is injected into the mould. The material and mould temperature depend on the nature of the thermoplastic. The operation of injection moulding onto the back of the film corresponds to the prior art.

Injection mouldings in which the bonding between the film inserted and the thermoplastic injection-moulded onto the back is very good can be formed, depending on the choice of film substrate and thermoplastic for injection-moulding onto the back.

If the film selected and the thermoplastic to be injection-moulded onto the back are not compatible in this sense, it is advisable to provide the reverse of the carrier film with an adhesive before material is injection moulded onto the back.

All the known adhesives with which substrates of plastic can usually be glued to one another can of course be employed. One-component or two-component adhesives based on polyurethane have proved suitable for injection-moulding various thermoplastics onto the back of various films.

Examples are the one-component polyurethane adhesive Dispercoll ® U 42 from Bayer AG or the two-component adhesive based on polyurethane with the base component Liofol ® UK 3645 and the crosslinking component Hardener UR 6210-22 from Henkel. Reference should also be made to the adhesives listed in DE-OS (German Published Specification) 3,619,032 for the production of laminates.

Thermoplastics which can be used in the context of the invention for injection-moulding onto the back of the substrates are ABS copolymers, polycarbonates, blends of ABS and polycarbonate, polyamides, polyether-imides, polyether-sulphones, polyether-ether-ketones and polyphenylene sulphide. These are the preferred thermoplastics for injection-moulding onto the back of substrates to produce injection-moulded circuits. All the thermoplastics customary in the injection moulding of plastics are of course also possible.

In a particular embodiment of the invention, the flexible circuits are preshaped three-dimensionally according to the external injection mould of the electronic circuit to be produced—especially if relatively complicated geometric shapes are to be produced. Preshaping of the flexible carriers is preferably carried out by known blow-moulding techniques. The customary vacuum or compressed air processes can be used for this purpose. However, a high-pressure moulding technique which is described in DE-OS (German Published Specification) 3,840,542 is preferably used. These blow-moulded flexible carriers can already carry the finished circuit or carry the dried print of the formulation containing an activator, which is then metallised in a metallisation bath after material has been injection-moulded onto the back.

It is of course possible for the thermoplastic material also to be injection moulded onto the side carrying the conductor track for protection from mechanical effects and dirt, so that the circuit is practically "buried".

Two-layered, plated-through circuits can also be produced by the techniques described above. It is also possible for material to be injection-moulded onto one side of the two-layered circuits to produce injection-moulded printed circuit boards, one conductor track plane automatically being covered ("buried").

The following examples are intended to illustrate the present invention without limiting the scope of the invention.

EXAMPLES

Examples 1

A polyester film 125 μm thick was printed over a part area with a screen printing paste containing an activator in accordance with DE-OS (German Published Specification) 3,637,256 using a semiautomatic screen printer. After drying at 150° C., the polyester film was provided with a copper deposit of about 3 μm on the printed areas for 1 hour in a Printoganth ® ML copper bath from Schering.

The reverse of the film was then coated with a two-component polyurethane-based adhesive from Henkel, consisting of the base component Liofol ® UK 3645 and the cross-linking component Hardener UK 6200 in a mixing ratio of 10:1, using a K-Hand-Coater film-drawing apparatus from Kockel, K bar No. 8 (100 μm moist application). The adhesive was dried in air.

The film treated in this way was placed in the injection mould of an injection-moulding machine at a mould temperature of 70° C. so that the side coated with adhesive was facing the injection nozzle, and an acrylic-butadienestyrene copolymer having a material temperature of 220° C. was injection-moulded onto the back. The Hostaphan ® film adhered exceptionally well to the ABS injection moulding.

An injection-moulded circuit which was capable of functioning was obtained in this manner; the electrical properties of the flexible circuit were not impaired by material being injection-moulded onto the back.

EXAMPLE 2

A polycarbonate film was printed over a part area, in a conductor track pattern, with a screen printing paste containing an activator in accordance with DE-OS (German Published Specification) 3,627,256 in a semiautomatic screen printer from Albert Frankenstein. After drying at 130° C., the polycarbonate film was treated in a Printoganth ® ML copper bath from Schering for 20 minutes, a copper layer about 1 μm thick being formed on the printed areas.

This flexible circuit was placed in an injection mould at a temperature of 90° C. so that the reverse of the circuit was facing the injection nozzle. The mould was then closed and a polycarbonate (Makrolon ® 2800, Bayer AG, material temperature 300° C.) was injection-moulded onto the back of the flexible circuit. The circuit-carrying film had a very good bonding to the injection moulding. In this manner it was possible to obtain an injection-moulded circuit which was capable of functioning; the copper conductor track was not damaged.

EXAMPLE 3

A polyester film Hostaphan ® RNBB from Hoechst (125 μm thick) was printed over a part area with a screen printing paste which contained, in accordance with DE-OS (German Published Specification) 3,627,256, a metallisation activator. Printing was carried out with a screen printing machine to give an electronic circuit. After drying at 150° C., the polyester film was dipped into a copper bath from Schering (Printoganth ® ML). A copper deposit of about 3 μm was formed on the printed areas within 1 hour by this process.

Thereafter, the reverse of the film was coated with a one-component adhesive based on polyurethane (PU 8100 from Bayer AG) using a manual film-drawing apparatus from Kockel (wet film thickness of 100 μm). The adhesive was dried in air. The film treated in this way was placed in an injection mould, the side coated with adhesive being directed towards the injection nozzle. Mould temperature; 90° C. Polycarbonate having a material temperature of 300° C. was injection-moulded onto the back. After removal from the mould, the polyester film adhered very well to the ABS injection moulding.

An injection-moulded circuit which was capable of functioning was obtained in this manner; the properties of the original flexible circuit on the polyester carrier were not impaired by polycarbonate being injection moulded onto the back.

EXAMPLE 4

As described in Example 3, a circuit print was produced on a polyester film Hostaphan ® from Hoechst by printing over a part area with a screen printing paste in accordance with DE-OS (German Published Specification) 3,627,256. This print was dried at 150° C. for 1 hour. The reverse of this film was then coated with a one-component adhesive based on polyurethane and, as described in Example 3, polycarbonate was injection-moulded onto the back in an injection mould.

After the injection-moulding onto the back of the film, the metallisation of the printed-on screen printing paste was now first carried out by dipping the injection-moulding into a Printoganth ® ML copper bath from Schering. 3 μm were deposited on the printed areas in the course of about 1 hour during this process, so that a three-dimensional circuit which was capable of functioning was formed.

EXAMPLE 5

A polyimide film Kapton ® HN 300 from Dupont 75 μm thick was printed over a part area, that is to say in the form of a conductor track pattern, with a screen printing paste containing an activator in accordance with DE-OS (German Published Specification) 3,743,780, using a semi-automatic printer. After drying at 230° C., the polyimide film was provided with a copper deposit of about 0.5 μm on the printed areas in a Noviganth ® T copper bath from Schering for 1 hour.

The reverse of the film was then coated with a two-component polyurethane-based adhesive from Henkel, consisting of the base component Liofol ® UK 3645 and the cross-linking component Hardener UK 6200 in a mixing ratio of 5:1, using a manual film-drawing apparatus from Kockel. The adhesive was dried in air. The film treated in this was was placed in an injection mould of a customary injection-moulding machine. The mould temperature was 90° C. The side of the film coated with adhesive was facing the injection nozzle. The mould was then closed and a polycarbonate (Makrolon ® 2800, Bayer AG) having a material temperature of 300° C. was injection-moulded onto the back of the flexible circuit. The Kapton ® film had an exceptionally good adhesion to the injection-moulding of polycarbonate.

An injection-moulded circuit which was capable of functioning was obtained in this manner.

EXAMPLE 6

A polyimide film Kapton ® VN from Dupont (75 μm thick) was printed over a part area, that is to say in the form of a conductor track pattern, with a screen printing paste which, in accordance with DE-OS (German Published Specification) 3,743,780, contained a metallisation activator. The printing was carried out with a screen printing machine. After drying at 230° C., the reverse of this film was coated with a one-component polyurethane-based adhesive and was placed in an injection mould and material was injection-moulded onto the back, as described. Mould temperature: 150° C. Polyphenylene sulphide (Tedur ®, Bayer AG) having a material temperature of 330° C. was employed as the thermoplastic.

After the material had been injection-moulded onto the back of the film, the metallisation of the printed-on screen printing paste was now first carried out by dipping the injection moulding into a Printoganth ® ML copper bath from Schering. 3 μm of copper were deposited on the printed areas in this bath in the course of about 1 hour, so that a three-dimensional circuit which was capable of functioning was formed.

EXAMPLE 7

A formulation in accordance with DE-OS (German Published Specification) 3,627,256 was knife-coated (wet film thickness about 15 μm) onto a 50 μm polyester film and dried at 155° C. The dried layer was coppered in a Cuposit ® 328 solution from Shipley for 20 minutes (copper application about 0.1 μm). A plating resist with the negative pattern of a circuit was then applied to the coppered film. Material was injection-moulded onto the back of the film with the circuit pattern as described in Example 3. The conductor tracks were then increased in thickness by electroplating, the resist was stripped off and the circuit onto the back of which material had been injection-moulded was obtained by differential etching.

EXAMPLE 8

A formulation in accordance with DE-OS (German Published Specification) 3,743,780 was knife-coated (about 20 μm) onto a 50 μm polyimide film and dried at 210° C. A plating resist with the negative pattern of a circuit was then applied to the film. The film with the circuit pattern was blow-moulded in accordance with DE-OS (German Published Specification) 3,840,542, polyphenylene sulphide (PPS) was injection moulded onto the back and a circuit with a copper layer thickness of 5 μm was then built up under electroless conditions.

EXAMPLE 9

A copper layer 0.2 μm thick was deposited on a 50 μm polyimide film by sputtering. A plating resist with the negative pattern of a circuit was then applied to the metallised film.

A polyether-imide was injection moulded onto the back of the film. The conductor tracks were then increased in thickness by about 20 μm by electroplating, the electro-plating resist was stripped off and the circuit onto the back of which material had been injection moulded was obtained by differential etching.

What is claimed is:

1. A process for the production of an injection molded printed circuit board comprising the steps of a) printing a conductor track pattern on the top surface of a flexible carrier, with a screen printing paste containing a metallization activator;
   b) conditioning said pattern for subsequent electroless metallization by drying or heat treatment;
   c) building up a copper layer in the form of said pattern, to a height ranging from 0.5–10 μm, in a chemical, electroless bath; and
   d) injection-molding a thermoplastic polymer material onto the back of said flexible carrier.

2. The process of claim 1, wherein said step of (c) building up of a copper layer in said chemical electroless bath is done after said step of (d) injection-molding a thermoplastic polymer material onto the back of said flexible carrier, and said copper layer is built up to a thickness of from 1 to 10 μm.

3. The process of claim 2 wherein said flexible carrier is a carrier that has been preshaped by blow molding.

4. A process for the production of an injection molded circuit board comprising the steps of a) printing the entire surface of a flexible carrier with a screen printing paste containing a metallization activator;
   b) conditioning said paste for subsequent electroless metallization by drying or heat treatment;
   c) providing said printed surface with a copper layer having a thickness of from 0.05–3 μm, in an electroless copper bath;
   d) applying a plating resist to said copper layer in the form of a negative conductor track pattern;
   e) building up a conductor track pattern corresponding to said negative conductor track pattern in a copper plating bath;
   f) stripping off said plating resist and etching; and
   g) injection molding a thermoplastic polymer material onto the back of said flexible carrier.

5. A process for the production of an injection molded printed circuit board comprising the steps of a) applying a paste formulation containing a metallization activator onto the entire surface of a flexible carrier;
   b) conditioning said paste formulation for electroless metallization by drying or heat treatment;
   c) injection molding a thermoplastic polymer material onto the back of said flexible carrier;
   d) applying a plating resist to said paste formulation in the form of a negative conductor track pattern;
   e) metallizing the conductor track pattern corresponding to said negative conductor track pattern in an electroplating copper bath to a thickness of from about 2 to about 3 μm; and
   f) stripping off said plating resist and etching said metallized conductor track pattern.

6. The process of claim 5, wherein said step (c) of injection molding a thermoplastic polymer material onto the back of said flexible carrier takes place after said step (e) of metallizing said conductor track pattern but before said step (f) of stripping off said plating resist and etching said metallized conductor track pattern.

7. The process of claim 5, wherein said step (c) of injection molding a thermoplastic polymer material onto the back of said flexible carrier takes place as a first step before any of said other steps.

* * * * *

UNITED STATES PATENT AND TRADEMARK OFFICE
CERTIFICATE OF CORRECTION

PATENT NO. : 5,233,753
DATED : August 10, 1993
INVENTOR(S) : Wolf, et al.

It is certified that error appears in the above-identified patent and that said Letters Patent is hereby corrected as shown below:

Col. 10, line 7  Delete " 0.5-10 " and substitute -- 0.05-10 --

Signed and Sealed this

Thirteenth Day of December, 1994

Attest:

BRUCE LEHMAN

*Attesting Officer*            *Commissioner of Patents and Trademarks*